United States Patent [19]

Min

[11] Patent Number: 4,622,088
[45] Date of Patent: Nov. 11, 1986

[54] PROCESS FOR PREPARING PHOTOPOLYMER FLEXOGRAPHIC ELEMENT WITH MELT EXTRUSION COATED ELASTOMERIC SURFACE LAYER

[75] Inventor: Joon H. Min, Spotswood, N.J.

[73] Assignee: E. I. Du Pont de Nemours and Company, Wilmington, Del.

[21] Appl. No.: 683,247

[22] Filed: Dec. 18, 1984

[51] Int. Cl.⁴ .................. B32B 31/00; G03C 1/68; G03C 1/74
[52] U.S. Cl. ............... 156/244.11; 430/271; 430/273; 430/281
[58] Field of Search ............ 156/244.11; 430/271, 430/273, 281

[56] References Cited

U.S. PATENT DOCUMENTS 4,323,637  4/1982  Chen et al. ..................... 430/271
4,427,759  1/1984  Gruetzmacher et al. ........ 430/273

*Primary Examiner*—Caleb Weston

[57] ABSTRACT

Process for preparing a flexographic photopolymer element by (a) passing into the nip of a calender a photopolymer composition mass comprising elastomeric binder, ethylenically unsaturated compound and photoinitiator and (b) calendering the photopolymer composition between a support and a multilayer cover element consisting essentially of a flexible cover film, optionally a flexible polymeric film, e.g., a polyamide, and a layer of elastomeric composition which is photosensitive or becomes photosensitive during or after calendering. At least the layer of elstomeric composition of the multilayer cover element is prepared by melt extrusion wherein mixing in an extruder is at 100° to 300° C. and after passing the hot melted mixture, e.g., at 100° to 300° C., into an extrusion die to form a layer, stretching the layer of extrudate to desired thickness, and applying onto a removable cover film. A flexible interleaf may be applied the bare surface of the extrudate layer. The element is useful for flexographic printing, e.g., dry offset, letterpress printing, etc.

19 Claims, 1 Drawing Figure

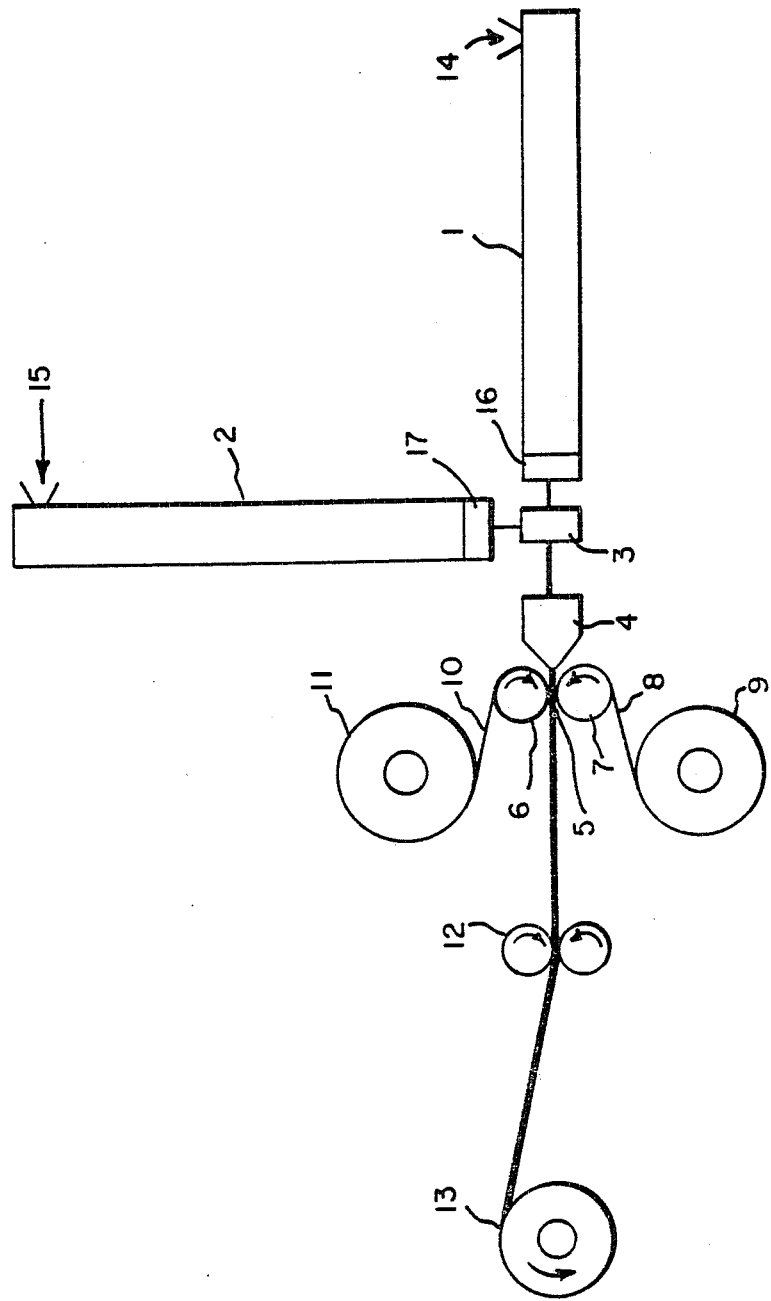

PROCESS FOR PREPARING PHOTOPOLYMER FLEXOGRAPHIC ELEMENT WITH MELT EXTRUSION COATED ELASTOMERIC SURFACE LAYER

DESCRIPTION

1. Technical Field

This invention relates to a process for preparing a photopolymer element bearing an overcoat layer. More particularly this invention relates to a process for preparing an overcoated photopolymer element wherein the overcoat layer which is photosensitive or becomes photosensitive is prepared by melt extrusion.

2. Background Art

Flexographic printing plates are well known for use in letterpress printing particularly on surfaces which are soft and easily deformable such as packaging materials, e.g., cardboard, plastic films, etc. Rubber plates are widely used for flexographic printing. Such plates are disadvantageous, however, because they are conventionally prepared by a laborious procedure involving art work, photographic negative, photoengraving, formation of a phenolic matrix, and hot press molding of a rubber plate. Flexographic printing elements having resilient surfaces can be prepared from elastomeric photopolymer compositions as described in Chen and Brennan U.S. Pat. No. 4,323,637. Such photopolymer elements have a flexible, polymeric film interposed between a cover sheet and the surface of the photopolymer layer. Upon imagewise exposure to actinic radiation, insolubilization of the photopolymer layer occurs in the exposed areas. Treatment with a suitable solvent removes the flexible, polymeric film and the unexposed areas leaving a printing relief.

Gruetzmacher and Munger U.S. Pat. No. 4,427,759 describes a process for preparing a different type flexographic photopolymerizable element from the element described by Chen and Brennan in their U.S. Pat. No. 4,323,637. The photopolymerizable element of Gruetzmacher and Munger comprises, in order, (1) a support, (2) a photopolymerizable layer comprising an elastomeric binder, ethylenically unsaturated compound and photoinitiator or photoinitiator system, (3) layer of elastomeric composition, (4) optionally a flexible, polymeric film, and (5) a flexible cover film. Such an element is prepared by passing into the nip of a calender a mass of hot photopolymer, and, while hot, calendering the photopolymer between support (1) and a multilayer cover element consisting essentially of layers (3) and (5) with layer (4) optionally present between layers (3) and (5). The layer of elastomeric composition (3) which is adjacent to photopolymerizable layer (2) is either photosensitive or becomes photosensitive during or after the calendering and is prepared as described in said U.S. Pat. No. 4,427,759 by coating the ingredients in a solvent, e.g., by extrusion coating. The Gruetzmacher and Munger element possesses advantages over flexographic photopolymerizable elements of the prior art. Upon imagewise exposure and development a printing surface is obtained which is hard and smooth without surface streaks. The printing surface possesses improved solvent resistance, exposure latitude with reverse depth, ink transfer and wearing properties.

It is desirable to prepare a flexographic photopolymerizable element which possesses the aforementioned advantages by an alternate cost saving process and which in addition results in additional advantages, e.g., improved print quality with water-based inks, no agglomeration of polymer particles in the layer elastomeric composition.

BRIEF DESCRIPTION OF THE DRAWING

FIG. 1 illustrates the preparation of a multilayer cover element by the use of two extruders, Extruder (1) equipped with a screen (16) extrudes a layer of elastomeric composition fed into the extruder at feed point (14) and extruder (2) equipped with a screen (17) extrudes a layer of flexible, polymeric film fed into the extruder at feed point (15) onto the layer of elastomeric composition within a coextrusion feed block (3). The two extruded layers then pass into an extrusion die (4) and into a nip (5) between two rolls (6), e.g., rubber covered, and roll (7), e.g., metal roll wherein the films become stretched. To the layer of elastomer is applied a removable film (8), e.g., silicone treated polyethylene terephthalate, from an unwind roll (9), and to the flexible, polymeric film is applied a film (10), e.g., polyethylene terephthalate, from an unwind roll (11). The four layer cover element is driven by a pair of drive rolls (12) and is wound onto a rewind roll (13) for subsequent use.

DISCLOSURE OF THE INVENTION

In accordance with this invention there is provided a process for preparing a flexographic photopolymerizable element which comprises (a) passing into the nip of a calender a mass of a hot photopolymerizable composition comprising an elastomeric binder, an ethylenically unsaturated compound, and a photoinitiator or photoinitiator system, and while hot (b) calendering the photopolymerizable composition between a support and a multilayer cover element to form a photopolymerizable layer therebetween, the multilayer cover element consisting essentially of a flexible cover film and a layer of an elastomeric composition and optionally between the flexible cover film and the layer of elastomeric composition a flexible polymeric film, the layer of elastomeric composition being adjacent to the photopolymerizable layer and being photosensitive or becoming photosensitive during or after calendering by contact with the photopolymerizable layer, the improvement wherein at least the layer of elastomeric composition of the multilayer cover element is prepared by melt extrusion which comprises (i) feeding into an extruder and mixing at 100° to 300° C. an elastomeric polymeric binder, a second polymeric binder and a nonmigratory dye or pigment and optionally one or more ethylenically unsaturated compounds and/or photoinitiator or initiator system; (ii) passing the hot melted mixture at 100° to 300° C. into an extrusion die to form a layer, (iii) stretching the layer of extrudate as it passes out of the extrusion die to achieve the desired thickness, (iv) applying the layer of extrudate onto a removable cover film, and (v) optionally applying a flexible removable interleaf film over the bare surface of the extrudate layer.

The photopolymerizable composition comprises an elastomeric binder such as a block copolymer, a nongaseous ethylenically unsaturated compound, an organic, radiation-sensitive, free-radical generating photoinitiator or system, preferably a dye, as well as other additives discussed below.

Polymeric molecular weights referred to herein are number average molecular weights. The number average molecular weights for polymers such as the block copolymers can be determined by membrane osmometry utilizing a gel cellophane 600 W membrane manufactured by Arro Laboratories, Inc., Joliet, Ill., toluene as the solvent at 29° C. The $\overline{M}_n$ for the nonelastomeric polymer blocks and elastomeric polymer blocks are preferably determined as follows:

A. The molecular weight of the first block (polystyrene) can be measured by gel permeation chromatography (GPC) of a terminated sample removed immediately after the polymerization. The chromatograph is calibrated using commercially available polystyrene molecular weight standards.

B. The $\overline{M}_n$ of the second block (polyisoprene or polybutadiene) can be determined in the following manner:

(1) measuring by suitably calibrated GPC the $\overline{M}_n$ of a sample of polystyrene-polyisoprene (or polybutadiene) diblock polymer terminated and removed immediately after its polymerization, and (2) subtracting from this value the $\overline{M}_n$ of the first block as determined in (A) above.

C. The $\overline{M}_n$ of the third block (polystyrene or other polymer) can be determined in the same general manner:

(1) measuring by suitably calibrated GPC the $\overline{M}_n$ of the sample of polystyrene-polyisoprene (or polybutadiene)-polystyrene triblock polymer, and (2) subtracting from this value the $\overline{M}_n$ of the diblock polymer obtained in (B) above.

One essential ingredient of the photopolymer composition is a high molecular weight elastomeric, polymeric binder, preferably a block copolymer having at least one unit of the general formula, A-B-A, wherein each A is an independently selected nonelastomeric polymer block having a number average molecular weight ($\overline{M}_n$) of 2000-100,000 and a glass transition temperature above 25° C. and B is an elastomeric polymer block having a number average molecular weight between about 25,000 and 1,000,000 and a glass transition temperature below about 10° C. The nonelastomeric blocks, A, having between them an elastomeric block, B, together comprise the unit A-B-A which represents the copolymers particularly suitable for use in combination with the photopolymerizable components in the compositions of the invention. This unit may comprise the entire general formula of the copolymer; it may be appended to another polymer chain; or it may be repeating. It is, of course, possible to vary the precise nature of the unit within the scope of the invention, e.g., by using two different nonelastomeric terminal blocks, A, wherein the glass transition temperature of one terminal block is between −30° C. and +25° C. or by creating block or graft polymeric substitutions in blocks A and B. Preferably, the elastomeric mid-section blocks, B, are polymers of aliphatic conjugated diolefins while the nonelastomeric blocks, A, are those formed by polymerizing alkenyl aromatic hydrocarbons, preferably vinyl substituted aromatic hydrocarbons, and still more preferably vinyl monocyclic aromatic hydrocarbons. Suitable block copolymers are disclosed in Holden et al. U.S. Pat. No. 3,265,765 and counterpart British Pat. No. 1,000,090, hereby incorporated by reference. Particularly preferred species of the subject copolymers comprise block copolymers of polystyrene terminal groups connected by a mid-section of polyisoprene or polybutadiene, e.g., polystyrene-polyisoprene-polystyrene or polystyrene-polybutadiene-polystyrene, the polydiene block being 70 to 90% by weight of the block copolymer. Other typical block copolymers useful in this invention are polystyrene-polybutadiene-polystyrene and polystyrene-polyisoprene-polystyrene block copolymers which have been hydrogenated according to the teachings of Jones, U.S. Pat. No. 3,431,323 and Hefele et al., U.S. Pat. No. 3,333,024. The hydrogenated block copolymers have the additional advantage of improved thermal and oxidative resistance. However, some residual unsaturation in hydrogenated block copolymers is desirable, since only very small concentrations of monomer are then needed in the photosensitive compositions to reduce solvent solubility upon exposure to actinic radiation. Still other typical block-copolymers useful in this invention are those wherein the terminal blocks are polyalkyl styrenes, e.g., poly(α-methyl styrene)-polyisoprene-poly(α-methyl styrene), and those composed of a plurality of polymer blocks. e.g., polyisoprene-polystyrene-polybutadiene-polystyrene-polyisoprene. Other elastomeric binders which are useful in the photopolymer compositions include: polymers of 1,3-butadiene, hydrocarbon- and halogen-substituted 1,3-butadiene, copolymers of 1,3-butadiene monomers with acrylic, alkylacrylic acids or the corresponding esters and/or nitriles, copolymers of 1,3-butadienes with aryl olefins, e.g., styrene, divinyl benzene, etc. Other elastomeric polymers are also useful, e.g., polyurethanes, carbonated polyvinyl alcohol, etc. Examples of such elastomeric polymeric binders are disclosed in Canadian Pat. No. 614,181 and U.S. Pat. Nos. 2,948,611, 4,177,074, 4,247,624, and 4,272,608, hereby incorporated by reference.

Useful addition-polymerizable ethylenically unsaturated compounds which form compatible mixtures with the aforesaid thermoplastic, elastomeric polymeric binders include but are not limited to:

t-butyl acrylate
N,N-diethylaminoethyl acrylate
1,4-butanediol diacrylate
hexamethylene glycol diacrylate
decamethylene glycol diacrylate
2,2-dimethylolpropane diacrylate
tripropylene glycol diacrylate
trimethylol propane triacrylate
2,2-di(p-hydroxyphenyl)-propane diacrylate
2,2-di(p-hydroxyphenyl)-propane dimethacrylate
polyoxyethyl-2,2-di(p-hydroxyphenyl)-propane dimethacrylate
polyoxypropyltrimethylol propane triacrylate (462)
butylene glycol dimethacrylate
hexamethylene glycol dimethacrylate
2,2,4-trimethyl-1,3-pentanediol dimethacrylate
1-phenyl ethylene-1,2-dimethacrylate
trimethylol propane trimethacrylate
diallyl fumarate
styrene
1,4-diisopropenyl benzene
1,3,5-triisopropenyl benzene, etc.

Compounds having two ethylenic groups are particularly preferred.

The photopolymer compositions of this invention essentially do not scatter the actinic radiation when in the form of thin layers, e.g., about 0.0005 to about 0.250 inch (0.013 to about 6.35 mm). In order to secure an essentially transparent mixture, i.e., a nonlight-scattering mixture, the elastomeric binder component should be compatible with and preferably soluble in, the ethylenic component when used within the aforementioned ratio range of 99:1 to about 1:1 wherein the ratio is the weight of elastomeric binder used to the weight of addition-polymerizable, ethylenically unsaturated compound used.

By compatibility is meant the ability of two or more constituents to remain dispersed with one another without causing appreciable scattering of actinic radiation. Compatibility is often limited by the relative proportions of the constituents and incompatibility is evidenced by formation of haze in the photosensitive composition. Some slight haze of layers formed from such compositions before or during exposure can be tolerated in the preparation of printing reliefs therefrom but when fine detail is desired, haze is preferably avoided. The amount of monomer used is therefore limited to those compatible concentrations below that which produces undesired light scatter or haze. The above compatible ethylenically unsaturated compounds form high-molecular weight addition polymers readily by photoinitiated addition polymerization in the presence of an addition polymerization initiator. Of course, the initiator absorbs sufficient radiant energy to initiate polymerization or crosslinking.

Another essential ingredient of the photopolymer compositions of this invention is an organic, radiation-sensitive, free-radical generating system. Practically any organic, radiation-sensitive, free-radical generating system which initiates polymerization of the unsaturated compound and does not excessively terminate the polymerization can be used in the photopolymer compositions of this invention. The term "organic" is used here and in the claims to designate compounds which contain carbon, and one or more of oxygen, hydrogen, nitrogen, sulfur and halogen, but no metal. Because process transparencies transmit heat originating from conventional sources of actinic radiation, and since the photopolymer compositions are usually prepared under conditions resulting in elevated temperatures, the preferred free-radical generating compounds are inactive thermally below 85° C. and more preferably below 185° C. They should be dispersible in the composition to the extent necessary for initiating the desired polymerization or crosslinking under the influence of the amount of radiation absorbed in relatively short term exposures. These initiators are useful in amounts from about 0.001 to about 10% by weight, and preferably from about 0.1 to about 5% based on the total weight of the solvent-free photopolymer composition.

The free-radical generating system absorbs radiation within the range of about 2000 to about 8000 Å and has at least one component that has an active radiation absorption band with molar extinction coefficient of at least about 50 within the range of about 2500 to about 8000 Å, and preferably about 2500 to about 5000 Å. The term "active radiation absorption band" means a band of radiation which is active to produce the free radicals necessary to initiate polymerization or crosslinking of the unsaturated material.

The free-radical generating system can comprise one or more compounds which directly furnish free radicals when activated by radiation. It can also comprise a plurality of compounds, one of which yields the free radicals after having been caused to do so by a sensitizer which is activated by the radiation.

A large number of such free-radical generating compounds can be utilized in the practice of the invention and include aromatic ketones such as benzophenone, Michler's ketone [4,4'-bis(dimethylamino)benzophenone], 4,4'-bis(diethylamino)benzophenone, 4-acryloxy-4'-dimethylaminobenzophenone, 4-acryloxy-4'-diethylaminobenzophenone, 4-methoxy-4'-dimethylaminobenzophenone, 2-phenyl-2,2-dimethoxyacetophenone(2,2-dimethoxy-1,2-diphenyl ethanone), 2-ethylanthraquinone, phenanthraquinone, 2-t-butylanthraquinone, 1,2-benzanthraquinone, 2,3-benzathraquinone, 2,3-dichloronaphthoquinone, benzil dimethyl acetal, and other aromatic ketones; benzoin, benzoin ethers such as benzoin methyl ether, benzoin ethyl ether, benzoin isobutyl ether, and benzoin phenyl ether, methylbenzoin, ethylbenzoin and other benzoins; and 2,4,5-triarylimidazolyl dimers such as 2-(o-chlorophenyl)-4,5-diphenylimidazolyl dimer, 2-(o-chlorophenyl-4,5-di(m-methoxyphenyl)imidazolyl dimer, 2-(o-fluorophenyl)-4,5-diphenylimidazolyl dimer, 2-(o-methoxyphenyl(-4,5-diphenylimidazolyl dimer, 2-(p-methoxyphenyl(-4,5-diphenylimidazolyl dimer, 2,4-di(p-methoxyphenyl)-5-phenylimidazolyl dimer, 2-(2,4-dimethoxyphenyl)-4,5-diphenylimidazolyl dimer, 2-(p-methylmercaptophenyl)-4,5-diphenylimidazolyl dimer, etc., as disclosed in U.S. Pat. Nos. 3,479,185 and 3,784,557 and in British Pat. Nos. 997,396 and 1,047,569. These patents are incorporated herein by reference.

The imidazolyl dimers can be used with a free-radical producing electron donor such as 2-mercaptobenzoxazole, Leuco Crystal Violet or tri(4-diethylamino-2-methylphenyl)methane. Such sensitizers as Michler's ketone may be added. Various energy transfer dyes such as Rose Bengal and Eosin Y can also be used. Additional examples of suitable initiators are disclosed by Plambeck in U.S. Pat. No. 2,760,863 which is incorporated herein by reference.

The photopolymer compositions may also contain a small amount of thermal addition polymerization inhibitor, e.g., 0.001% to 2.0%, based on the weight of the total solvent-free photopolymer composition. Suitable inhibitors include hydroquinone and alkyl and aryl-substituted hydroquinones, 2,6-di-tert-butyl-4-methylphenol, p-methoxyphenol, tert-butylpyrocatechol, pyrogallol, beta-naphthol, 2,6-di-tert-butyl-p-cresol, phenothiazine, pyridine, nitrobenzene, dinitrobenzene and the nitroso dimer inhibitor systems described in U.S. Pat. No. 4,168,982 which is incorporated by reference. Other useful inhibitors include p-toluquinone, chloranil and thiazine dyes, e.g., Thionine Blue G (CI 52025), Methylene Blue B (CI 52015) and Toluidine Blue (CI 52040). Such compositions can be photopolymerized or photocrosslinked without removal of the inhibitor. The preferred inhibitors are 2,6-di-tert-butyl-4-methylphenol and p-methoxyphenol.

Other additives include: colorants, e.g., dyes; antioxidants, antiozonants, fillers or reinforcing agents, plasticizers, etc. The colorants present in the photopolymer composition must not interfere with the imagewise exposure. Suitable colorants are designated "window dyes" which do not absorb actinic radiation in the region of the spectrum that the initiator present in the composition is activatable. The colorants include: CI 109 Red dye, Methylene Violet (CI Basic Violet 5), "Luxol" Fast Blue MBSN (CI Solvent Blue 38), "Pontacyl" Wool Blue BL (CI Acid Blue 59 or CI 50315), "Pontacyl" Wool Blue GL (CI Acid Blue 102 or CI 50320), Victoria Pure Blue BO (CI Basic Blue 7 or CI 42595), Rhodamine 3 GO (CI Basic Red 4), Rhodamine 6 GDN (CI Basic Red 1 or CI 45160), 1,1'-diethyl-2,2'-cyanine iodide, Fuchsine dye (CI 42510), Calcocid Green S (CI 44090) and Anthraquinone Blue 2 GA (CI Acid Blue 58), etc.

Antioxidants useful in this invention include: alkylated phenols, e.g., 2,6-di-tert-butyl-4-methylphenol; alkylated bis-phenols e.g., 2,2-methylene-bis-(4-methyl-6-tert-butylphenol); 1,3,5-trimethyl-2,4,6-tris-(3,5-di-tert-butyl-4-hydroxybenzyl)benzene; 2-(4-hydroxy-3,5-di-tert-butylanilino)-4,6-bis-(n-octylthio)-1,3,5-triazine; polymerized trimethyldihydroquinone; and dilauryl thiopropionate.

Antiozonants useful in this invention include: microcrystalline wax and paraffin wax; dibutylthiourea, 1,1,3,3-tetramethyl-2-thiourea; Antiozonant AFD, a product of Nafton Co.; norbornenes, e.g., di-5-norbornene-2-methyl adipate, di-5-norbornene-2-methyl terephthalate; Ozone Protector 80, a product of Reichhold Chemical Co.; N-phenyl-2-naphthylamine; unsaturated vegetable oils, e.g., rapeseed oil, linseed oil, safflower oil; polymers and resins, e.g., ethylene/vinyl acetate copolymer resin, chlorinated polyethylene, chlorosulfonated polyethylene, chlorinated ethylene/methacrylic acid copolymer, polyurethanes, polypentadienes, polybutadiene, furfural-derived resins, ethylene/propylene/diene rubber, diethylene glycol ester of rosin and alpha-methylstyrene/vinyltoluene copolymer. Ozone resistance of the printing relief produced can also be improved by annealing it at elevated temperatures prior to use.

If desired, the photopolymer compositions can also contain immiscible, polymeric or nonpolymeric organic or inorganic fillers or reinforcing agents which are essentially transparent at the wavelengths used for exposure of the photopolymer material and which do not scatter actinic radiation, e.g., polystyrene, the organophilic silicas, bentonites, silica, powdered glass, colloidal carbon, as well as various types of dyes and pigments. Such materials are used in amounts varying with the desired properties of the elastomeric compositions. The fillers are useful in improving the strength of the elastomeric layer, reducing tack and, in addition, as coloring agents.

The photopolymer layer preferably contains a compatible plasticizer to lower the glass transition temperature of the binder and facilitate selective development. The plasticizer may be any of the common plasticizers compatible with the polymeric binders. Among the common plasticizers are dialkyl phthalates, alkyl phosphates, polyethylene glycol, polyethylene glycol esters, and polyethylene glycol ethers. Other useful plasticizers include oleic acid, lauric acid, etc. Polyesters are preferred plasticizers, e.g., polyethylene sebacate, etc. The plasticizer is generally present in an amount of 1 to 15% by weight based on weight of total solids of the photopolymer composition.

The photopolymer compositions of this invention can be prepared in many ways by admixing the three essential constituents specified above., i.e., (A) the compatible solvent-soluble elastomeric binder compounds described above, (B) the addition-polymerizable, ethylenically unsaturated compound, and, uniformly dispersed throughout, (C) an addition-polymerization initiator activatable by actinic radiation. For example, flowable or extrudable compositions can be made by mixing them and other desired adjuvants in any order and, if desired, with the aid of a solvent, e.g., chlorinated hydrocarbons, e.g., chloroform, carbon tetrachloride, trichloroethylene and chlorotoluene; ketones, e.g., methyl ethyl ketone, diethyl ketone and methyl isobutyl ketone; aromatic hydrocarbons, e.g., benzene, toluene and xylene; and tetrahydrofuran. The above solvents can contain as diluents small amounts of acetone, lower molecular weight alcohols, e.g., methyl, ethyl, propyl; aliphatic hydrocarbons such as petroleum ether and solvent naphtha; and esters, e.g., methyl, ethyl and butyl acetate. The solvent can be removed later by heating the admixture or extruded layer.

The photopolymer composition can be formed into a hot melt by placing in a mixing device such as a rubber mill which may be part of a calender device or by placing in an extruder which performs the function of melting, mixing, deaerating and filtering the composition. A suitable extruder is a twin screw extruder although other known commercial extruders can be used. The temperature of the melt in the extruder is within the range of about 100° to 300° C., and the time the composition remains in the extruder ranges from about 0.25 to 5 minutes.

The composition is then passed from the mixing device or extruder into the nip of a calender, and the composition is calendered while hot between two smooth flat surfaces. The calendering can occur between two flexible supports including multiple layer or compound supports. One support is a multilayer cover element. The other support preferably is a flexible film or sheet such as a polyethylene terephthalate film, optionally bearing a subbing layer of adhesive, material or primer or a release layer, e.g., of silicone. Other suitable supports include: flame-treated or electron-treated polyethylene terephthalate, polyimide film as disclosed in U.S. Pat. No. 3,179,634 which is incorporated herein by reference, flexible metal sheets and foils, e.g., steel, aluminum; compound supports such as the above sheet supports with a back layer of an elastomeric composition or rubber, etc.

The multilayer cover element consists essentially of a flexible cover film, optionally a flexible, polymeric film, and a layer of an elastomeric composition which is photosensitive or preferably becomes photosensitive during or after the calendering by contact with the photopolymer composition. The elastic modulus of the elastomeric layer of the element in the polymerized state should not be substantially less than the elastic modulus of the photopolymer layer in the exposed state. A useful range of elastic modulus of the elastomeric layer is 0.5 to 15 times that of the photopolymer layer when both are in the exposed or polymerized state. The elastomeric modulus is determined by ASTM D-638 taken at 200% elongation.

Useful flexible cover films of the multilayer cover element include: polyethylene terephthalate which preferably is unsubbed but optionally may be subcoated with a thin silicone layer, polystyrene, polyethylene, polypropylene, or other strippable film. The flexible polymeric film layer is present adjacent to the cover film. This layer is solvent soluble or strippable during processing of the exposed element to form a relief image and preferably is a polyamide, copolymer of ethylene and vinyl acetate, etc. The flexible polymeric film thickness is in the range of about 0.0001 to 0.0015 inch (0.0025 to 0.038 mm).

Adjacent to the flexible, polymeric film is a layer of an elastomeric composition (overcoat layer). The elastomeric composition generally contains an elastomeric material which is the same as or similar to the elastomeric binder present in the photopolymer layer. Different type elastomeric binders, however, can be used in the elastomeric composition and photopolymer layers provided that the layer of elastomeric composition and photopolymer layer have an elastic modulus as described above. Suitable elastomeric polymers have been described previously above in conjunction with the photopolymer composition. Additional components present in the elastomeric composition include: a second binder which can be a nonelastomeric polymer, optionally but preferably a nonmigrating dye or pigment which provides a contrasting color with any colorant, e.g., dye, present in the photopolymer layer, and optionally one or more ethylenically unsaturated monomeric compounds as set forth above, and/or a photoinitiator or initiator system also as described above when the elastomeric composition is photopolymerizable, and optionally antiblocking agents. The second binder can be a polymer or interpolymer of methyl methacrylate/acrylonitrile/butadiene/styrene, alpha methyl styrene/styrene/acrylonitrile, styrene/methyl methacrylate, acrylonitrile/butadiene/styrene, butadiene, isoprene, chloroprene, styrene/butadiene, styrene/isoprene or combinations, etc. The contrast color dye can be Acid Blue 92 (CI 13390), or any other dyes disclosed in U.S. Pat. No. 3,218,167, column 5, lines 35 to 44, which is incorporated herein by reference. Useful antiblocking agents include: polyolefin particles or beads, waxes, polyethylene; hard particles or beads such as glass (silicon dioxide), etc. Dioctyl sodium sulfosuccinate or other known slip agents can be used. The antiblocking agent prevents sticking of the multilayer cover element in roll form prior to the calendering operation. The elastomeric compositions contain the following parts by weight of indicated components:
elastomeric binder: 50 to 98 parts
second binder: 2 to 50 parts
dye or pigment: 0 to 5 parts
monomer(s) (optional): 0 to 20 parts
photoinitiator (optional): 0 to 10 parts The elastomeric composition used in the multilayer cover element can be prepared in several ways. In one method a polymer resin (second binder) and dye or pigment are physically mixed in a blender or other mixing device. The dry blend is then blended for about 0.25 to 5 minutes with an elastomeric binder, e.g., block copolymer, etc., in an extruder, single or twin screw type (which is preferred), or other polymer compounding machinery wherein the elastomeric composition is prepared.

Another method of preparing the elastomeric composition is to meter the ingredients, e.g., elastomeric binder, polymer resin (second binder), dye or pigment, and other ingredients that may be present into an extruder as described above or other polymer compounding machinery. The time for blending is generally 0.25 to 5 minutes. The blending temperature can vary depending on the melting point and rheology of the ingredients. Useful temperature ranges are from 100° to 300° C., preferably 150° to 250° C. Below 100° C. the ingredients generally are not mixed very well. Above 300° C. the elastomeric composition may degrade. The blend of elastomeric composition depending on the type of blending device used can be in the form of sheeting which can be cut into relatively narrow strips for subsequent use, or preferably extruded in noodle-like form or other thin configuration. A preferred final form of the elastomeric composition is as pellets, e.g., 0.125 inch (3.2 mm) in diameter and 0.125 and 0.250 inch (3.2 to 6.35 mm) in length. The pellets can be prepared as described in Example 3 below wherein the extruded elastomeric composition is placed in a quench bath of cold water and the cooled elastomeric composition is run into a rotary cutter or other pelletizing means. Underwater pelleting is also useful as described in Example 4 below. The elastomeric composition after extrusion through a die passes into a cutter device, e.g., 3-blade rotary cutter, immersed in flowing water. As soon as the pellets are formed they are carried by the water discharge into a dryer device, e.g., spinning dryer, from which they can be collected and stored for future use.

The elastomeric composition, in a form as described above, preferably pellets of the composition, are fed or metered into an extruder, e.g., of the type described above and illustrated in the examples below. The mixing or blending occurs at 100° to 300° C., generally for 0.25 to 5 minutes. The hot melted mixture passes into an extrusion die generally at a temperature in the range of 100° to 300° C. to form a layer (film). The layer thickness can vary, e.g., 0.001 to 0.01 inch (0.025 to 0.25 mm), preferably 0.0015 to 0.006 inch (0.038 to 0.152 mm). The width of the layer is dependent on the particular die used. The layer of extrudate is drawn or stretched as it leaves the die to provide the thickness desired. The drawing ratio is 5:1 to 50:1, preferably 10:1 to 20:1.

The extruded layer of elastomeric composition is applied onto a removable cover film, e.g., a polyethylene terephthalate or other film described above. Preferably to the opposite side of the layer of elastomeric composition is applied a flexible interleaf film, e.g., silicone-treated polyethylene terephthalate film or other easily strippable film to protect the bare surface of the elastomeric layer from damage in subsequent wind-up or packaging. Preferably the layer of elastomeric composition and a layer of flexible, polymeric film, described above, are coextruded in contact with one another, e.g., as described in the examples below and in FIG. 1. To the bare surface of the elastomeric layer is applied a flexible interleaf film of a type described above and to the bare surface of the flexible, polymeric film is applied a removable cover film of a type as described above. The multilayer cover element thus formed can be stored for subsequent use, or the flexible interleaf film adjacent to the elastomeric layer can be removed by stripping or other means and the multilayer cover element can be calendered together with the layer of photopolymer.

As noted above the calendering of the photopolymer can occur between two supports. When the supports are flexible films or sheets as described above, one is subsequently removed from the surface of the photopolymer layer without damage thereto, and a multilayer cover element also as described above is either laminated to the photopolymer layer at a temperature in the range of 20° to 180° C., or the multilayer cover element and the photopolymer layer are pressed into contact at a temperature of 20° to 180° C. This invention requires that the elastomeric overcoat layer be present adjacent to the photopolymer layer in the manufactured photopolymer elements used to prepare flexographic printing plates.

After the photopolymer element is prepared by the calendering operation, it is cooled, e.g., with blown air, and is passed under a bank of fluorescent lamps, e.g., black light tubes, placed transverse to the path of movement. The element is continually exposed through the support to partially polymerize a predetermined thickness of the photopolymer layer adjacent to the support, e.g., about 0.001 to 0.030 inch (0.025 to 0.76 mm) for a 0.112 inch (about 2.85 mm) thick photopolymer layer. The element can be cut into suitable size sheets.

Prior to the imagewise exposure described more fully below, the photopolymer element is exposed through its support to polymerize a predetermined thickness of the photopolymer layer adjacent to the support. This polymerized portion of the photopolymer layer is designated a floor. The floor thickness varies with the time of exposure, exposure source, etc. The exposure is generally for 1 to 30 minutes.

The cover sheet present on the polymeric film layer can be removed leaving the flexible, polymeric film and elastomeric film on the photopolymer element. The photopolymer element is then exposed to actinic radiation, e.g., through an image-bearing transparency or stencil having areas transparent to actinic radiation and of substantially uniform optical density and areas opaque to actinic radiation and of substantially uniform optical density until substantial polymerization or photocrosslinking takes place. Thus the radiation-exposed portions of the layer are converted to the insoluble state with no significant polymerization or crosslinking taking place in the unexposed portions or areas of the layer. Unexposed portions of the layer are removed by means of a liquid, e.g., solvent for the thermoplastic-elastomeric block copolymer. During the polymerization or crosslinking, insolubilization occurs and the elastomeric binder/ethylenically unsaturated compound containing composition is converted to the insoluble state. The hard surface of the polymeric film prevents the transparency from sticking or adhering to the surface of the photopolymer element during the imaging steps and is generally removed with the solvent processing step.

Actinic radiation from practically any source and of any type can be used in the process of this invention. The radiation may emanate from point sources or be in the form of parallel rays or divergent beams. By using a broad radiation source, relatively close to the image-bearing transparency, the radiation passing through the clear areas of the transparency enters as divergent beams and thus irradiates a continually diverging area in the photopolymerizable layer underneath the clear portions of the transparency, resulting in a polymeric relief having its greatest width at the bottom of the photopolymerized layer, i.e., a frustum, the top surface of the relief being the dimensions of the clear area. Inasmuch as the free-radical-generating polymerization initiators activatable by actinic radiation generally exhibit their maximum sensitivity in the ultraviolet range, the radiation source should furnish an effective amount of this radiation. Such sources include carbon arcs, mercury-vapor lamps, fluorescent lamps with special ultraviolet-light-emitting phosphors, argon glow lamps, and photographic flood lamps. Of these, the mercury-vapor lamps, particularly the sunlamp or "black light" type, and the fluorescent sunlamps, are most suitable.

The radiation exposure time may vary from fractions of a second to minutes, depending upon the intensity and spectral energy distribution of the radiation, its distance from the composition and the nature and amount of the composition available. Customarily, a mercury vapor arc, a sunlamp or high ultraviolet output fluorescent tubes are used at a distance of about 1.5 to about 60 inches (3.8 to 152 cm) from the photopolymer composition. Exposure temperatures are not particularly critical, but it is preferred to operate at about ambient temperatures or slightly higher, i.e., about 20° to about 35° C.

When highly reflective supports are used, oblique rays passing through clear areas in the image-bearing transparency will strike the surface of the base at an angle other than 90° and after reflection will cause polymerization in the nonimage areas. This disadvantage can be overcome when the photopolymer layer is on a radiation-reflective support by an intervening stratum sufficiently absorptive of actinic radiation so that less than 35% of the incident radiation is reflected. The layer absorptive of reflected radiation or nonradiation scattering layer, or antihalation layer, can be made by dispersing a finely-divided dye or pigment which substantially absorbs actinic radiation in a solution or aqueous dispersion of a resin or polymer which is adherent to both the support and the photoinsolubilized image and coating it on the support to form an anchor layer which is dried. Suitable antihalation pigments include carbon black, manganese dioxide, dyes, e.g., Acid Blue Black (CI 20470) and Acid Magenta O (CI 42685). A dyed metal plate is also useful.

The antihalation layer intermediate between the photopolymer layer and the reinforcing support when used must have adequate adhesion to the reinforcing support and the photopolymer layer and not react with the radiation-absorptive material. Suitable polymeric or resin carriers for the radiation-absorptive dyes or pigments which can be used include polyvinyl compounds, e.g., polyvinyl chloride homopolymers, and copolymers, e.g., vinyl chloride with vinyl acetate, diethyl fumarate or ethyl acrylate. Copolymers of acrylic and methacrylic acid may also be used.

The solvent liquid used for washing or developing the plates made from the photopolymer compositions of this invention should have good solvent or stripping action on the unimaged or unexposed photopolymerizable, elastomeric layer and flexible, polymeric film and little action on the insolubilized image areas of the exposed photopolymerizable and elastomeric layers or upon the support material, antihalation layer, or anchor layer in the period required to remove the nonpolymerized or noncrosslinked portions. Methyl ethyl ketone, benzene, toluene, xylene, carbon tetrachloride, trichloroethane, trichloroethylene, methylchloroform, tetrachloroethylene, etc. are particularly useful solvents. Best results are sometimes obtained when the solvent is warm, e.g., 30°–50° C. or when the solvent is used in a mixture with a nonsolvent, e.g., trichloroethylene with ethanol. Incorporation of such nonsolvents reduces swelling of the insolubilized image.

In the development step where the relief is formed, the solvent may be applied in any convenient manner, as by pouring, immersion, spraying, or roller application. Brushing aids in the removal of the unpolymerized or uncrosslinked portion of the composition.

The printing plate, after development, is dried at a temperature in the range of about 40° to 75° C., preferably 60° C., until the plate retains its original thickness. A forced hot air drier or other suitable drier can be used for this purpose. The dry plate can then be given a post exposure treatment or can be detackified or undergo both treatments. Generally the dry plate is detackified for 1 to 3 minutes in a solution such as aqueous acidic hypochlorite or an aqueous solution having a free bromine concentration of 0.01 to 3.5% by weight and pH of 0.7 to 6.5, for about 15 seconds to 20 minutes. Post exposure is accomplished by exposing the developed printing plate to a source of actinic radiation, preferably to the actinic radiation source used for the imagewise exposure. The post exposure can be either prior to or subsequent to the detackification treatment and generally is of 5 to 15 minutes duration. A preferred embodiment of the invention is described in Example 3.

INDUSTRIAL APPLICABILITY

Printing reliefs made from the photopolymer elements prepared as described in this invention are particularly useful for flexographic printing wherein a resilient print area is required, e.g., for printing on deformable printing surfaces. The ink is carried by the raised portion of the relief such as in dry-offset printing, ordinary letterpress printing, the latter requiring greater height differences between printing and nonprinting areas. The printing plates are also useful for multicolor printing.

The printing reliefs possess the many advantages for printing reliefs prepared as described in Gruetzmacher and Munger U.S. Pat. No. 4,427,759. Among these advantages are: printing surface can possess a contrasting color with the photopolymer layer; the printing surface is hard thus improving printing clarity with improved ink transfer, wear and solvent resistance; improved exposure latitude and reverse depth. Surprisingly, important additional advantages have been noted. The printing plates are particularly useful in printing with water-based inks. Furthermore, no agglomeration of particles in the layer of elastomeric composition has been noted. The cost of producing the printing plates also is materially reduced.

EXAMPLES

The invention is illustrated by but is not intended to be limited to the following examples wherein the parts and percentages are by weight. In the examples the coded designations for the various screw elements are:
KP is undercut
KPN is transition
KB is kneading block
RH is right-handed
N is neutral
LH is left-handed
SK is undercut

EXAMPLE 1

The following ingredients were dry blended in a Patterson-Kelley Shell Blender (conical), manufactured by Patterson-Kelley Co., Division of Harsco Corp., East Stroudsburg, PA.

| Dry Blend Ingredients | Amount (parts) |
|---|---|
| Methyl methacrylate(46)/acrylonitrile(9)/butadiene(14)/styrene(31)tetrapolymer resin | ~32.64 |
| Atlantic Fast Wool Blue R Conc. dye[1] | ~0.78 |

[1]C.I. 13390 Acid Blue 92 dye Atlantic Chemical Industries, Nutley, New Jersey.

The dry blend and a polystyrene-polyisoprene-polystyrene block copolymer, Kraton ® 1107 block copolymer Shell Chemical Co., Polymers Division, Houston, Tex., 66.58 parts, were separately metered into a Werner and Pfleiderer ZSK 28 mm twin-screw extruder equipped with a filter and sheeting die. The screw configuration for the 28 mm twin-screw extruder was as follows:

| Screw Element | Running Length (mm) | |
|---|---|---|
| 45/45 KP | 45 | |
|  |  | ←Raw Material Feeds |
| 45/45 KP | 90 | |
| 45/15 KPN | 105 | |
| 45/45 | 150 | |
| 30/30 | 180 | |
| 24/48 | 228 | |
| 24/08 | 236 | |
| 15/60 | 296 | |
| 15/30 | 326 | |
| 15/15 | 341 | |
| KB/15 RH | 356 | |
| KB/20 N | 376 | |
| KB/30 N | 406 | |
| KB/15 LH | 421 | |
| KB/30 RH | 451 | |
| KB/20 N | 471 | |
| KB/30 N | 501 | |
| 24/08 LH | 509 | |
| 24/08 LH | 517 | |
| 24/24 | 541 | |
| 45/45 | 586 | |
|  |  | →Vacuum |
| 45/45 | 631 | |
| 30/60 | 691 | |
| 30/30 | 721 | |
| 15/60 | 781 | |
| 15/60 | 841 | |
| 15/30 | 871 | |
| 15/15 | 886 | |
| Screw Tip | | |

Barrel Temperature: 150–200° C.
Screw Speed: 500 RPM
Extrusion Rate: 4.5 PPH

The blending time was 0.5 to 3 minutes. The extruded blend was in sheeting form which can vary from 0.050 to 0.200 inch (1.27 to 5.08 mm) in thickness. The sheeting was cut into strips 0.125 to 0.500 inch (3.185 to 12.7 mm) in width.

A flexible, polymeric film forming material is a polyamide resin, Macromelt 6900, a product of Henkel Adhesives Company, a division of Henkel Corporation, 4620 West 77th Street, Minneapolis, MN is essentially colorless, has a Ball and Ring Softening Point, of 266°–302° F.; melt index at 347° F. of 5–15 g/10 minutes; flash point 570° F.; percent water absorption, 1 day is 0.2, 7 days is 0.5; tensile yield of 1,200 psi; tensile break of 3,500 psi; and elongation of 540%. The tensile yield, tensile break and elongation are determined at 24° C. according to ASTM Procedure D-1708).

As shown in FIG. 1, extrusion apparatus (1 of FIG. 1) for the extrusion of a layer of the elastomeric composition described above and extrusion apparatus (2 of FIG. 1) for the extrusion of the flexible, polymer film forming material also as described above were arranged. Extruders 1 and 2 were each 1 inch (2.54 cm) single screw extruders with L/D (length/diameter ratio) of 24/1 and equipped with 3-zone temperature controllers and 100 mesh screen at the end (16 of FIG. 1 for extruder 1, and 17 of FIG. 1 for extruder 2). Extruder 1 had a screw configuration of 2.5:1 compression ratio and extruder 2 had a screw configuration of 6:1 compression ratio. Between extruders 1 and 2 and a die (4 in FIG. 1), 6 inches (15.24 cm) wide, are present a coextrusion feed block (3 in FIG. 1) to provide multilayers.

TWO LAYER COEXTRUSION

The strips of elastomeric composition described above were fed into extruder 1 (at feed point 14 of FIG. 1) and the flexible, polymeric film forming material described above was fed into extruder 2 (at feed point 15 of FIG. 1). The operating conditions for the coextrusion were as follows:

| Conditions | Extruder 1 | Extruder 2 |
|---|---|---|
| Screw Speed (rpm) | 78 | 7 |
| Zone 1 °F. (°C.) | 325 (163) | 300 (149) |
| Zone 2 °F. (°C.) | 410 (210) | 375 (191) |
| Zone 3 °F. (°C.) | 425 (218) | 450 (232) |
| Melt °F. (°C.) | 444 (227) | — |
| Pressure psi | 3,000 | — |
| Line speed fpm | 55 | |
| Die Temp. °F. (°C.) | 400 (204) | |
| Die lip opening inch (mm) | 0.025 (0.635 mm) | |

The two coextruded layers (films), layer of elastomeric composition and layer of polymeric film forming material passed from the coextrusion feedblock into the 6 inch (15.24 cm) die and subsequently into a nip (5 in FIG. 1) between two rolls, the upper roll a 5 inch (12.7 cm) diameter rubber covered roll (6 in FIG. 1) and the lower roll a 5 inch (12.7 cm) diameter stainless steel roll (7 in FIG. 1) wherein the films became stretched resulting in films 5 inches (12.7 cm) in width (drawing ratio 15/1). The thickness of the two films was about 0.002 inch (0.51 mm), the thickness ratio of elastomeric film to flexible polymeric film was about 10:1. As the coextruded films passed through the nip there was applied to the elastomeric film a silicone treated polyethylene terephthalate film 0.001 inch (0.025 mm) thick, release "Mylar" film, Custom Coating and Laminate, Inc., Worcester, MA (flexible interleaf film, 8 in FIG. 1) from an unwind roll (9 in FIG. 1) and to the flexible, polymeric film a polyethylene terephthalate film, 0.005 inch (0.127 mm) thick (10 in FIG. 1) from an unwind roll (11 in FIG. 1). Drive rolls (12 in FIG. 1) moved the multilayer cover element onto a rewind roll (13 in FIG. 1). The wound roll of multilayer cover element was ready for subsequent use.

A photopolymerizable, thermoplastic composition is prepared as follows:

1.40 parts 2,2-dimethoxy-2-phenylacetophenone is dissolved in a mixture of 5.30 parts hexamethylene glycol diacrylate, 3.70 parts hexamethylene glycol dimethacrylate, 0.166 part 2,6-di-tertiary-butyl-para-cresol and 0.001 part hydroquinone. A solution of C.I. 109 Red Dye (0.003 part) in hydroxyethyl methacrylate (0.13 part) is added to the mixture. This solution is added to 82.30 parts polystyrene-polyisoprene-polystyrene block copolymer ("Kraton" 1107, manufactured by Shell Chemical Co., Polymers Division, Houston, Tex.) in a twin screw extruder. A mixture of 6.0 parts α-methyl styrene/vinyl toluene resin (softening point 100° C., refractive index 1.583, viscosity at 25° C. for a 65% solution in toluene is 1.6–1.9 poises, manufactured by Hercules, Inc., Wilmington, DE), and 1.0 part grated microcrystalline hydrocarbon wax (melting point 73°–76° C., flash point 113° C., manufactured by International Wax Refining Co., Valley Stream, N.Y. is melted at about 100° C. and is metered into the photopolymer mixture in the extruder. The twin screw extruder performs the function of melting, mixing, deaerating and filtering the photopolymer composition.

The photopolymer composition is extruded at 160° C. through a die. The extruded composition enters the rotating bank in a two-roll calender and is calendered between a film and a multilayer cover element, the film being a 0.005 inch (0.127 mm) flame-treated polyethylene terephthalate support film, and the multilayer cover element being as described above except that the polyethylene terephthalate film with its silicone subbing is removed as the element is unwound and fed to the calender. The elastomeric overcoat layer contacts the extruded photopolymer and becomes laminated thereto. The element formed during calendering is 0.117 inch (2.98 mm) in thickness.

The photopolymer element is cooled with blown air and is passed under a bank of black light fluorescent tubes, Sylvania's BL lamps, placed transverse to the path of movement, continually exposing the element through its support to polymerize a predetermined thickness of the photopolymer layer adjacent to the support. The element is cut into 18-inch (45.72 cm) lengths.

The photopolymer element is placed in an exposure unit, as described below, and is given an overall exposure in air through the support for a predetermined length of time (for example, a 0.112-inch (about 2.85 mm) thick photopolymer layer requiring the polymerization of an 0.080 inch (2.03 mm) portion of the layer is exposed for about 3 minutes depending on lamp intensity).

The polyethylene terephthalate film on the surface of the polyamide layer is stripped therefrom. The polyamide layer remains adhered to the elastomeric overcoat layer which is now photosensitive. The hard, flexible smooth polyamide surface is covered with an image-bearing transparency, and the photopolymer layer is imagewise exposed for 6 minutes under vacuum in a "Cyrel" 3040 Exposure Unit (registered trademark of E. I. du Pont de Nemours and Company) fitted with Sylvania BL-VHO fluorescent lamps.

After exposure the transparency is removed, and the exposed element is placed in a rotary drum-brush type "Cyrel" 3040 Processor. The polyamide layer and unpolymerized areas of the element are removed in the processor by washing with a mixture of 75 volume percent tetrachloroethylene/25 volume percent n-butanol. The developed element (printing plate) is placed in a forced hot air drier and is dried at 60° C. until the plate attains its original thickness. The dry plate is then detackified for 1 to 3 minutes in a solution aqueous acidic hypochlorite (900 part water, 90 parts "Clorox", 10 parts conc. HCl). The wet plate is post-exposed in air for 10 minutes using the same exposure source used for the imagewise exposure described above. The plate has a "Shore" A hardness in the range of 50–55. The printing surface, polymerized photosensitive overcoat, has a deep blue contrasting color and is free of surface streaks.

The plate can now be mounted on a flexographic press cylinder with commercially available double sided adhesive tape and printed with standard flexographic inks. The print quality is equal to or better than that produced with rubber plates printed in the same manner.

The above procedure is repeated except that only extruder 1 is used to extrude the layer of elastomeric composition onto a polyethylene terephthalate film, 0.005 inch (0.127 mm) in thickness bearing a polyamide layer about 0.00017 inch (0.004 mm) thick. The supported polyamide layer is prepared by coating the following polyamide resin coating solution using an extrusion die coater.

| Ingredient | Amount (%) |
|---|---|
| Methylene chloride | 81.0 |
| Methanol | 2.0 |
| N—methyl pyrrolidone | 10.0 |
| Polyamide resin described above | 7.0 |

A printing plate similar to that described above is prepared.

EXAMPLE 2

A dry blend of elastomer and dye and block copolymer as described in Example 1 were separately metered into a Werner and Pfleiderer ZSK 53 mm twin-screw extruder equipped with a filter and sheeting die. The screw configuration for the 53 mm twin-screw extruder was as follows:

| Screw Element | Running Length (mm) |
|---|---|
| 45/45 | 45 |
| 9/180 SK | 225 |
| ←Raw Material Feeds | |
| 90/180 SK | 405 |
| 60/180 | 585 |
| 60/60 | 645 |
| 45/180 | 825 |
| 45/90 | 915 |
| 45/45 | 960 |
| 45/15 | 975 |
| KB/90 RH | 1065 |
| 60/180 | 1245 |
| KB/30 RH | 1275 |
| KB/90 RH | 1365 |
| KB/90 LH | 1455 |
| 45/30 LH | 1485 |
| 90/180 | 1665 |
| KB/30 LH | 1695 |
| KB/30 LH | 1725 |
| 90/180 | 1905 |
| 90/30 | 1935 |
| 90/30 | 1965 |
| 90/180 | 2145 |
| →Vacuum | |
| 90/180 | 2325 |
| 60/180 | 2505 |
| 60/259 | 2764 |
| Screw Tip | |

Barrel Temperature: 150–200° C.
Screw Speed: 250 RPM
Extrusion Rate: 50–100 PPH

The blending time was 0.5 to 3 minutes. The extruded blend was in sheeting form which can vary from 0.050 to 0.200 inch (1.27 to 5.08 mm) in thickness. The sheeting was cut into strips 0.125 to 0.500 inch (3.185 to 12.7 mm) in width.

A double extruder arrangement similar to that described in Example 1 was prepared except that the single screw extruders were 2.5 inch (6.35 cm) for extruder 1 and 1.25 inch (3.175 cm) for extruder 2 with a length-/diameter ratio (L/D) of 30/1. The compression ratio of the screw configurations was 3:1. A 350 mesh screen was placed at the end of each extruder. The extrusion die made 27 inch (68.58 cm) wide coatings of 0.002 to 0.005 inch (0.005 to 0.013 mm) in thickness.

The two layer extrusion was accomplished as described in Example 1 with the strips of elastomeric composition being fed into extruder 1 and the flexible polymeric film forming material being fed into extruder 2. The operating conditions for the coextruders were as follows:

| Conditions | Extruder 1 | Extruder 2 |
|---|---|---|
| Screw Speed (rpm) | 61.5 | 10.2 |
| Zone 1 °F. (°C.) | 391 (199) | 394 (201) |
| Zone 2 °F. (°C.) | 388 (198) | 393 (201) |
| Zone 3 °F. (°C.) | 394 (201) | 396 (202) |
| Zone 4 °F. (°C.) | 402 (206) | — |
| Melt °F. (°C.) | 403 (206) | 369 (187) |
| Pressure (psi) | 2700 | — |
| Line speed (fpm) | 61.6 | |
| Die Temp. °F. (°C.) | 399 (204) | |
| Die lip opening inch (mm) | 0.020 (0.508) | |

The coextruded 27 inch (68.58 cm) wide films were stretched at a drawing ratio of about 10:1. The thickness of the two films was about 0.003 inch (0.076 mm) with the thickness ratio of elastomeric film to flexible, polymeric film being about 10:1.

The printing plate with a melt extrusion coated elastomeric overcoat layer described in Example 1 was mounted on a flexographic press cylinder with commercially available double sided adhesive tape and printed with a commercial water based flexographic ink (Clark Graphicolor WP-10250 Aquagloss Black). The print quality was improved over that of a flexographic printing plate with the solvent coated elastomeric overcoat layer described in Gruetzmacher and Munger U.S. Pat. No. 4,427,759. The print obtained by the printing element of this invention gave uniformly dark print in solid areas, whereas the print obtained by the printing element of said patent was very light and had unacceptable print density in solid areas.

EXAMPLE 3

This example illustrates the pelletizing of the elastomeric composition prior to use in the melt extrusion of a film of elastomeric composition.

Into a Werner and Pfleiderer ZSK 83 mm twin-screw extruder were separately metered each of the following three ingredients from Sample A or Sample B in the amounts indicated.

| Ingredient | Amount (pounds) |
|---|---|
| Sample A | |
| 1. Block copolymer described in Example 1 | 665.8 |
| 2. Polymeric resin described in Example 1 | 326.4 |
| 3. Blue dye described Example 1 | 7.8 |
| Sample B | |
| 1. Block copolymer described in Example 1 | 665.8 |
| 2. Polymeric resin described in Example 1 | 330.4 |
| 3. Blue pigment[1] | 4.0 |

[1]Pigment Blue 15, 15-1012 PV Fast Blue A2R, American Hoechst Corp., 129 Quidnick Street, Coventry, R.I.

The operating conditions for the extruder were as follows:

| Conditions | |
|---|---|
| Zone 1 °F. (°C.) | 360 (182) |

-continued

| Conditions | |
|---|---|
| Zone 2 °F. (°C.) | 355 (179) |
| Zone 3 °F. (°C.) | 340 (171) |
| Zone 4 °F. (°C.) | 320 (160) |
| Zone 5 °F. (°C.) | 300 (149) |
| Die Temp °F. (°C.) | 390 (199) |

The screw configuration for the extruder was as follows:

| Screw Element | Running Length (mm) |
|---|---|
| 45/90 | 90 |
| 120/120 SK | 210 |
| | ←Raw Material Feeds |
| 120/120 | 450 |
| 90/90 | 540 |
| 90/90 | 630 |
| KB/120 RH | 750 |
| KB/90 N | 840 |
| 120/120 | 960 |
| KB/60 RH | 1020 |
| KB/60 LH | 1080 |
| KB/60 LH | 1140 |
| 60/120 | 1260 |
| 60/60 | 1320 |
| KB/60 RH | 1380 |
| KB/60 RH | 1440 |
| KB/60 LH | 1500 |
| 90/90 | 1590 |
| 60/60 | 1650 |
| KB/30 RH | 1680 |
| KB/30 LH | 1710 |
| 120/120 | 1830 |
| 120/120 | 1950 |
| | →Vacuum |
| 120/120 | 2070 |
| 90/90 | 2160 |
| 90/90 | 2250 |
| 90/90 | 2340 |
| 90/90 | 2430 |
| 60/60 | 2490 |
| Rear End Spacer | (30) |

Screw Speed: 150 RPM
Extrusion Rate: 400 PPH

The elastomeric composition came out of the die after about 0.5 to 3 minutes in the form of noodles and dropped into a quench tank 18 feet (5.5 m) in length filled with cold water (15°–20° C.). The noodles passed into pull rolls and into a rotary cutter where pellets about 0.125 inch (3.2 mm in diameter and 0.125 to 0.250 inch (3.2 to 6.35 mm) in length were formed.

The procedure of Example 2 was repeated replacing the cut strips with pellets as described above. Printing plates comparable to those prepared as described in Example 2 are obtained.

EXAMPLE 4

This example illustrates the under water pelletizing of the elastomeric composition prior to use in the melt extrusion of a film of elastomeric composition.

Into one of the following described Werner and Pfleiderer ZSK 53 mm twin-screw extruders were separately metered the three ingredients from Sample A described in Example 3. The operating conditions for the extruders were as follows:

| Conditions | Extruder 1 | Extruder 2 |
|---|---|---|
| Zone 1 °F. (°C.) | 365 (185) | 365 (185) |
| Zone 2 °F. (°C.) | 415 (213) | 415 (213) |

-continued

| Conditions | Extruder 1 | Extruder 2 |
|---|---|---|
| Zone 3 °F. (°C.) | 415 (213) | 360 (182) |
| Zone 4 °F. (°C.) | 390 (199) | 350 (177) |
| Zone 5 °F. (°C.) | 345 (174) | 345 (174) |
| Zone 6 °F. (°C.) | 390 (199) | 330 (166) |
| Zone 7 °F. (°C.) | 410 (210) | 410 (210) |
| Pressure psi | 400 | 870 |
| Vacuum | 15 | 15 |
| Screen | 20 mesh | 60 mesh |
| Die temp. °F. (°C.) | 390 (199) | 390 (199) |

The screw configuration for each of the extruders was as follows:

| Screw Element | Running Length (mm) |
|---|---|
| Extruder 1 | |
| 60/60 | 60 |
| 90/120 SK | 180 |
| | ←Raw Material Feeds |
| 90/120 SK | 300 |
| 90/90 | 390 |
| 60/60 | 450 |
| KB/90 RH | 540 |
| KB/30 N | 570 |
| KB/30 N | 600 |
| 45/30 | 630 |
| 90/120 | 750 |
| 60/60 | 810 |
| KB/30 RH | 840 |
| KB/30 LH | 870 |
| KB/30 LH | 900 |
| 45/90 | 990 |
| 60/120 | 1110 |
| KB/90 RH | 1200 |
| KB/30 LH | 1230 |
| 60/120 | 1350 |
| 90/180 | 1530 |
| 90/180 | 1710 |
| | →Vacuum |
| 90/30 | 1740 |
| 90/180 | 1920 |
| 60/60 | 1980 |
| 60/60 | 2040 |
| 60/120 | 2160 |

Screw Speed: 250 RPM
Extrusion Rate: 400 PPH

| Screw Element | Running Length (mm) |
|---|---|
| Extruder 2 | |
| 60/60 | 60 |
| 90/120 SK | 180 |
| | ←Raw Material Feeds |
| 90/120 SK | 300 |
| 90/180 | 480 |
| 60/60 | 540 |
| KB/30 RH | 570 |
| KB/30 N | 600 |
| 45/30 | 630 |
| 45/30 | 660 |
| 90/120 | 780 |
| 60/60 | 840 |
| KB/30 RH | 870 |
| KB/30 LH | 900 |
| 45/90 | 990 |
| 90/90 | 1080 |
| 60/60 | 1140 |
| KB/30 RH | 1170 |
| KB/30 N | 1200 |
| KB/30 LH | 1230 |
| 60/120 | 1350 |
| 90/180 | 1530 |
| | →Vacuum |
| 90/180 | 1710 |
| 90/30 | 1740 |
| 90/180 | 1920 |
| 60/60 | 1980 |
| 60/60 | 2040 |

-continued

| Screw Element | Running Length (mm) |
| --- | --- |
| 60/120 | 2160 |

Screw Speed: 250 RPM
Extrusion Rate: 385-420 PPH

Immediately after the extrusion die there was located a 3-blade rotary cutter inside water. The pellets of elastomeric composition in the size described in Example 3 passed through the water outlet of the rotary cutter into a spinning dryer from which they were collected for future use.

The procedure of Example 2 was repeated replacing the cut strips with pellets as described above. Printing plates comparable to those prepared as described in Example 2 are obtained.

EXAMPLE 5

Example 1 was repeated except that the ingredients of the dry blend were as follows:

| Ingredient | Amount (parts) |
| --- | --- |
| Alpha methyl styrene/styrene/acrylonitrile resin[1] | 32.64 |
| Blue dye, Example 1 | 0.78 |

[1]The resin has a tensile strength of 9000 psi; tensile modus psi × $10^5$; Tg of 125° C.; izod impact strength ⅛ inch notched of 0.3 ft. lbs/inch; refractive index of 1.57; specific gravity of 1.09; hardness, Rockwell R of 123, sold as Blendex ® 586, Borg-Warner Chemicals, Inc., Parkersburg, West Virginia.

The dry blend and block copolymer, 66.58 parts, described in Example 1 were separately metered into a Werner and Pfleiderer ZSK 28 mm twin-screw extruder as described in Example 1 having the following screw configuration:

| Screw Element | Running Length (mm) |
| --- | --- |
| 45/45 KP | 45 |
| | ←Raw Material Feeds |
| 45/45 KP | 90 |
| 45/15 KPN | 105 |
| 45/45 | 150 |
| 45/45 | 195 |
| KB/45 RH | 240 |
| KB/30 N | 270 |
| 45/45 | 315 |
| KB/15 RH | 330 |
| KB/45 LH | 375 |
| 15/60 | 435 |
| KB/45 RH | 480 |
| KB/15 LH | 495 |
| 24/48 | 1543 |
| KB/15 RH | 558 |
| 30/10 LH | 568 |
| 45/45 | 613 |
| | →Vacuum |
| 45/45 | 658 |
| 30/60 | 718 |
| 30/60 | 778 |
| 24/48 | 826 |
| 15/60 | 886 |

Barrel Temperature: 150-200° C.
Screw Speed: 500 RPM
Extrusion Rate: 5-15 PPH

The extrusion coating arrangement described in Example 1 was utilized without extruder 2 wherein the conditions for extrusion were as follows:

| Conditions[1] | Extruder 1 |
| --- | --- |
| Screw Speed (rpm) | 40 |
| Zone 1 °F. (°C.) | 325 (163) |
| Zone 2 °F. (°C.) | 300 (149) |
| Zone 3 °F. (°C.) | 300 (149) |
| Pressure psi | 1900 to 2200 |
| Line speed (fpm) | 50 |
| Die Temp. °F. (°C.) | 290 (143) to 300 (149) |
| Die lip opening inch (mm) | 0.030 (0.762) |

[1]two extrusions were made with different pressure and die temperature but other conditions remaining the same.

A printing plate of quality comparable to the printing plate of Example 1 is prepared.

I claim:

1. In a process for preparing a flexographic photopolymerizable element which comprises (a) passing into the nip of a calender a mass of a hot photopolymerizable composition comprising an elastomeric binder, an ethylenically unsaturated compound, and a photoinitiator or photoinitiator system, and while hot (b) calendering the photopolymerizable composition between a support and a multilayer cover element to form a photopolymerizable layer therebetween, the multilayer cover element consisting essentially of a flexible cover film and a layer of an elastomeric composition and optionally between the flexible cover film and the layer of elastomeric composition a flexible polymeric film, the layer of elastomeric composition being adjacent to the photopolymerizable layer and being photosensitive or becoming photosensitive during or after calendering by contact with the photopolymerizable layer, the improvement wherein at least the layer of elastomeric composition of the multilayer cover element is prepared by melt extrusion which comprises (i) feeding into an extruder and mixing at 100° to 300° C. an elastomeric polymeric binder, a second polymeric binder and a nonmigratory dye or pigment and optionally one or more ethylenically unsaturated compounds and/or photoinitiator or initiator system; (ii) passing the hot melted mixture at 100° to 300° C. into an extrusion die to form a layer, (iii) stretching the layer of extrudate as it passes out of the extrusion die to achieve the desired thickness, (iv) applying the layer of extrudate onto a removable cover film, and (v) optionally applying a flexible removable interleaf film over the bare surface of the extrudate layer.

2. A process according to claim 1 wherein a flexible polymeric film is coextruded with the elastomeric layer onto a removable film, the removable cover film being applied to the bare surface of the flexible, polymeric film.

3. A process according to claim 1 wherein the removable cover film has present thereon a flexible, polymeric film to which the layer of elastomeric composition is applied.

4. A process according to claim 1 wherein prior to feeding the ingredients into the extruder the ingredients are blended and pelletized.

5. A process according to claim 1 wherein prior to feeding the ingredients into the extruder the ingredients are blended and then pelletized under water.

6. A process according to claim 1 wherein the elastomeric layer in the multilayer cover element is a photopolymerizable elastomeric layer.

7. A process according to claim 1 wherein the flexible cover film in the multilayer cover element is a film bearing a silicone release layer.

8. A process according to claim 1 wherein the flexible polymeric film is a polyamide film.

9. A process according to claim 1 wherein the elastomeric binder in the multilayer cover element comprises an elastomeric block copolymer.

10. A process according to claim 9 wherein the block copolymer is a polystyrene-isoprene-polystyrene block copolymer.

11. A process according to claim 9 wherein the block copolymer is a polystyrene-polybutadiene-polystyrene block copolymer.

12. A process according to claim 1 wherein the photopolymerizable composition is extruded at a temperature in the range of about 150° to 250° C.

13. A process according to claim 1 wherein the elastomeric binder of the photopolymerizable composition is an elastomeric block copolymer.

14. A process according to claim 13 wherein the block copolymer is a polystyrene-polyisoprene-polystyrene block copolymer.

15. A process according to claim 13 wherein the block copolymer is a polystyrene-polybutadiene-polystyrene block copolymer.

16. A process according to claim 13 wherein the ethylenically unsaturated compound has two terminal ethylenic groups.

17. A process according to claim 15 wherein the ethylenically unsaturatd compound is hexamethylene glycol diacrylate, hexamethylene glycol dimethacrylate or a mixture of both.

18. A process according to claim 1 wherein a colorant is present in the photopolymerizable layer.

19. A process according to claim 18 wherein a nonmigrating dye or pigment is present in the layer of elastomeric composition of the multilayer cover element which provides a contrasting color with the colorant in the photopolymerizable layer.

* * * * *